(12) United States Patent
Koerner

(10) Patent No.: US 7,893,699 B2
(45) Date of Patent: Feb. 22, 2011

(54) METHOD FOR IDENTIFYING ELECTRONIC CIRCUITS AND IDENTIFICATION DEVICE

(75) Inventor: Heiko Koerner, Soeding (AT)

(73) Assignee: Infineon Technologies AG, Neubiberg (DE)

( * ) Notice: Subject to any disclaimer, the term of this patent is extended or adjusted under 35 U.S.C. 154(b) by 250 days.

(21) Appl. No.: 11/949,398

(22) Filed: Dec. 3, 2007

(65) Prior Publication Data
US 2009/0140720 A1    Jun. 4, 2009

(51) Int. Cl.
*G01R 31/36* (2006.01)
(52) U.S. Cl. .............................. 324/750.15; 324/750.18
(58) Field of Classification Search ................. 324/770, 324/764; 323/82
See application file for complete search history.

(56) References Cited

U.S. PATENT DOCUMENTS

| | | | | |
|---|---|---|---|---|
| 4,996,647 A | * | 2/1991 | Gasser | 702/73 |
| 5,018,041 A | * | 5/1991 | Szepesi | 361/18 |
| 5,818,738 A | * | 10/1998 | Effing | 716/4 |
| 6,154,043 A | * | 11/2000 | Conboy et al. | 324/764 |
| 6,161,213 A | * | 12/2000 | Lofstrom | 716/4 |
| 6,624,994 B1 | * | 9/2003 | Schmoock et al. | 361/93.1 |
| 7,102,358 B2 | * | 9/2006 | Keshavarzi et al. | 324/522 |
| 7,342,408 B2 | * | 3/2008 | Kim | 324/765 |
| 7,394,273 B2 | * | 7/2008 | Hsu et al. | 324/763 |
| 7,802,156 B2 | * | 9/2010 | Bitting et al. | 714/724 |
| 2006/0061341 A1 | * | 3/2006 | Wang | 323/282 |
| 2006/0232266 A1 | * | 10/2006 | Kelly | 324/158.1 |
| 2006/0267621 A1 | * | 11/2006 | Harris et al. | 324/765 |
| 2008/0061865 A1 | * | 3/2008 | Koerner | 327/512 |

\* cited by examiner

*Primary Examiner*—Ha Tran T Nguyen
*Assistant Examiner*—Richard Isla Rodas
(74) *Attorney, Agent, or Firm*—Dickstein Shapiro LLP

(57) ABSTRACT

An identification device for electronic circuits comprises at least two electronic components having different electronic characteristics, a detection unit configured to detect at least one electrical parameter determining the electronic characteristics of the electronic components and an evaluation unit configured to evaluate a mismatch exhibited by the at least two electronic components with respect to each other. In order to distinguish different electronic circuits, the at least one electrical parameter of the electronic components is detected by the detection unit and is analyzed by the evaluation unit.

18 Claims, 5 Drawing Sheets

FIG 4

| N | U1 [mV] | U2 [mV] | U3 [mV] |
|---|---|---|---|
| 1 | 1076 | 1164 | 1188 |
| 2 | 1107 | 1104 | 1150 |
| 3 | 1356 | 1328 | 1232 |
| 4 | 1249 | 1072 | 1293 |
| 5 | 1059 | 1221 | 1433 |
| 6 | 1190 | 1202 | 1135 |
| 7 | 1217 | 1116 | 1224 |
| 8 | 945 | 999 | 1062 |
| 9 | 1066 | 1115 | 1186 |
| 10 | 967 | 1089 | 1096 |
| 11 | 1389 | 995 | 1341 |
| 12 | 983 | 1136 | 1054 |
| 13 | 1190 | 1252 | 1199 |
| 14 | 1043 | 1291 | 1058 |
| 15 | 977 | 1094 | 1121 |
| 16 | 1278 | 1200 | 1267 |
| 17 | 1008 | 1115 | 959 |
| 18 | 1123 | 1181 | 1117 |
| 19 | 1006 | 975 | 1064 |
| 20 | 1228 | 1417 | 1188 |
| 21 | 1364 | 1179 | 1278 |
| 22 | 1315 | 1315 | 1508 |
| 23 | 1159 | 1104 | 1012 |
| 24 | 1195 | 1066 | 1052 |
| 25 | 1365 | 1140 | 1132 |
| 26 | 1204 | 1357 | 1197 |
| 27 | 1101 | 1046 | 1143 |
| 28 | 1214 | 1308 | 1461 |
| 29 | 1213 | 1223 | 1218 |
| 30 | 1301 | 1261 | 1301 |
| 31 | 1166 | 1143 | 1242 |
| 32 | 1305 | 1229 | 1146 |
| 33 | 1264 | 1471 | 1401 |
| 34 | 1135 | 1221 | 1089 |
| 35 | 1131 | 1020 | 1153 |
| 36 | 1184 | 1176 | 1068 |
| 37 | 1388 | 1072 | 1371 |
| 38 | 1125 | 1171 | 1308 |
| 39 | 1182 | 1209 | 1195 |
| 40 | 1425 | 1362 | 1198 |
| 41 | 1172 | 970 | 1107 |
| 42 | 1298 | 1195 | 1090 |
| 43 | 1273 | 1263 | 1190 |
| 44 | 1345 | 1236 | 1209 |
| 45 | 1276 | 1531 | 1376 |
| 46 | 1147 | 1206 | 1244 |
| 47 | 1057 | 1384 | 1241 |
| 48 | 1166 | 1241 | 1239 |
| 49 | 1357 | 1322 | 1427 |
| 50 | 1284 | 1238 | 1158 |
| Average | 1195 | 1194 | 1202 |
| ST. Dev. | 124 | 125 | 122 |

METHOD FOR IDENTIFYING ELECTRONIC CIRCUITS AND IDENTIFICATION DEVICE

BACKGROUND

Electronic circuits, especially semiconductor circuits, are produced in large numbers. Such kind of mass production of electronic circuits having identical functions results in slightly different electronic characteristics of the components contained in the electronic circuits. Even though a large number of such electronic circuits are fabricated, it is sometimes necessary to identify and select specific electronic circuits.

SUMMARY

The present invention provides a simple means of identifying electronic circuits without adding additional memory components especially non-volatile memory components to the electronic circuits.

According to one aspect of the present invention, the identification device for electronic circuits comprises at least two electronic components having different electronic characteristics, a detection unit configured to detect at least one electrical parameter determining the electronic characteristics of the electronic components and an evaluation unit configured to evaluate a mismatch exhibited by the at least two electronic components with respect to each other by analyzing the at least one electrical parameter of the electronic components detected by the detection unit.

The method for identifying electronic circuits according to the present invention comprises providing at least two electronic components in the electronic circuit wherein the at least two electronic components exhibit slightly different electronic characteristics, detecting at least one electrical parameter of the electronic components by a detection unit, determining a mismatch exhibited by the at least two electronic components with respect to each other by means of an evaluation unit on the basis of the at least one electrical parameter and identifying the electronic circuit by analyzing the mismatch of the electronic components provided in the electronic circuit with respect to each other.

DRAWINGS

Embodiments of the present invention are depicted in the drawings and are detailed in the description which follows.

Figure 3A:
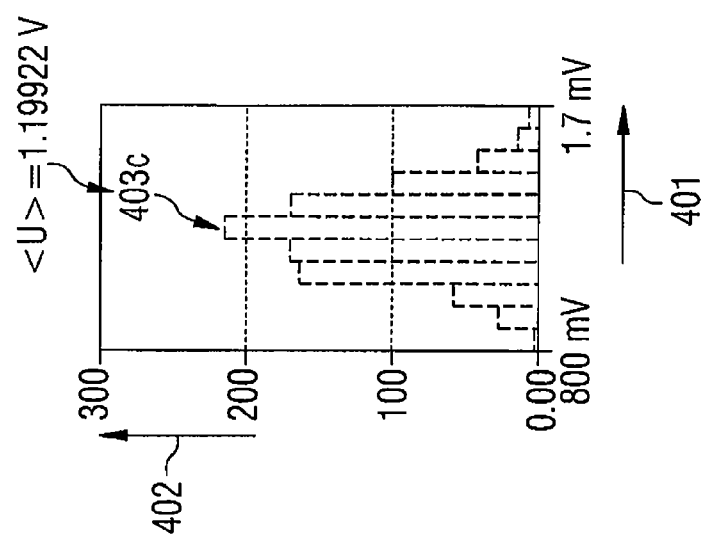
Figure 3B:
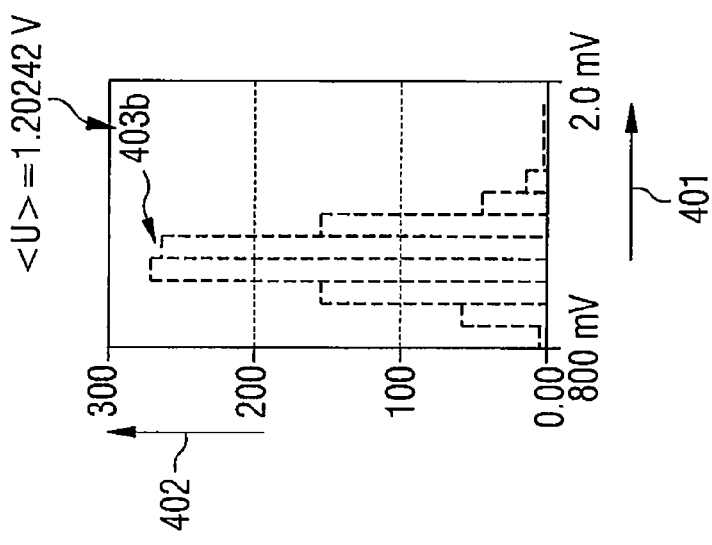
Figure 3C:
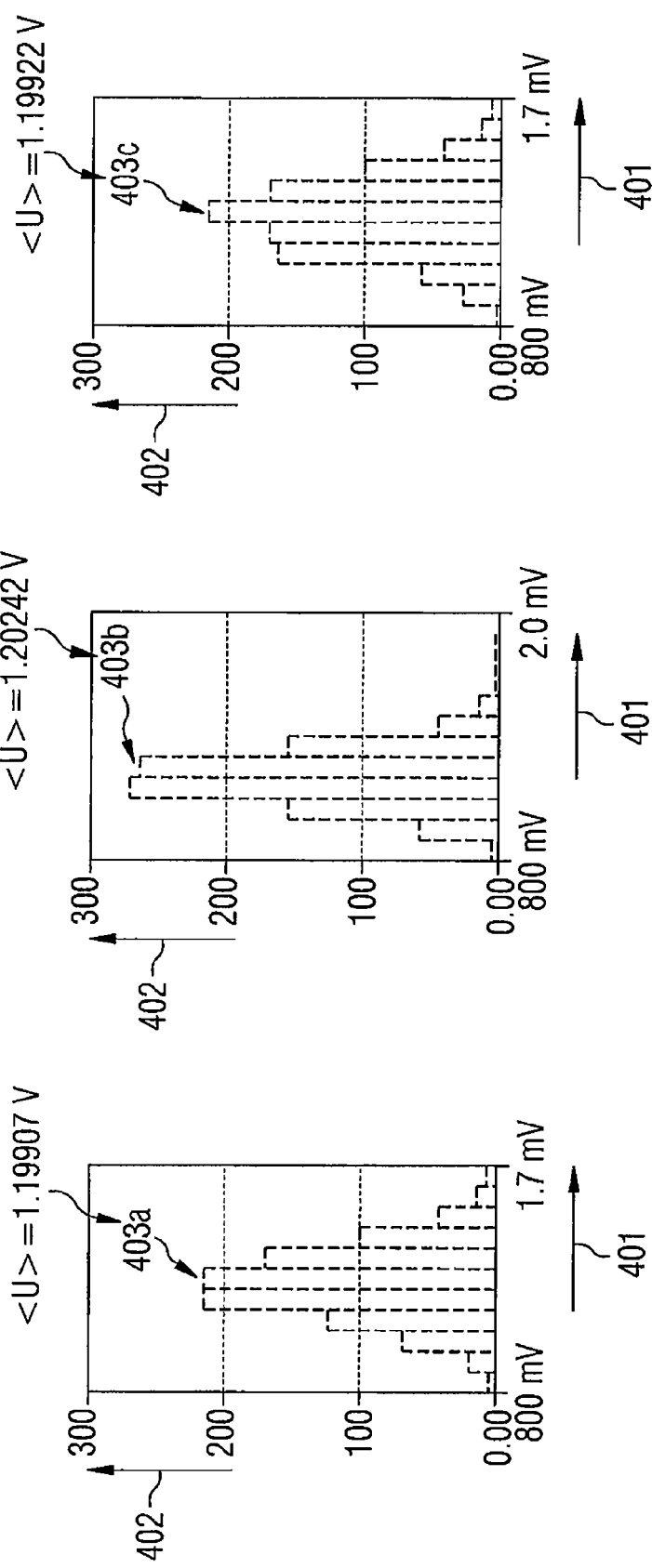
Figure 5:
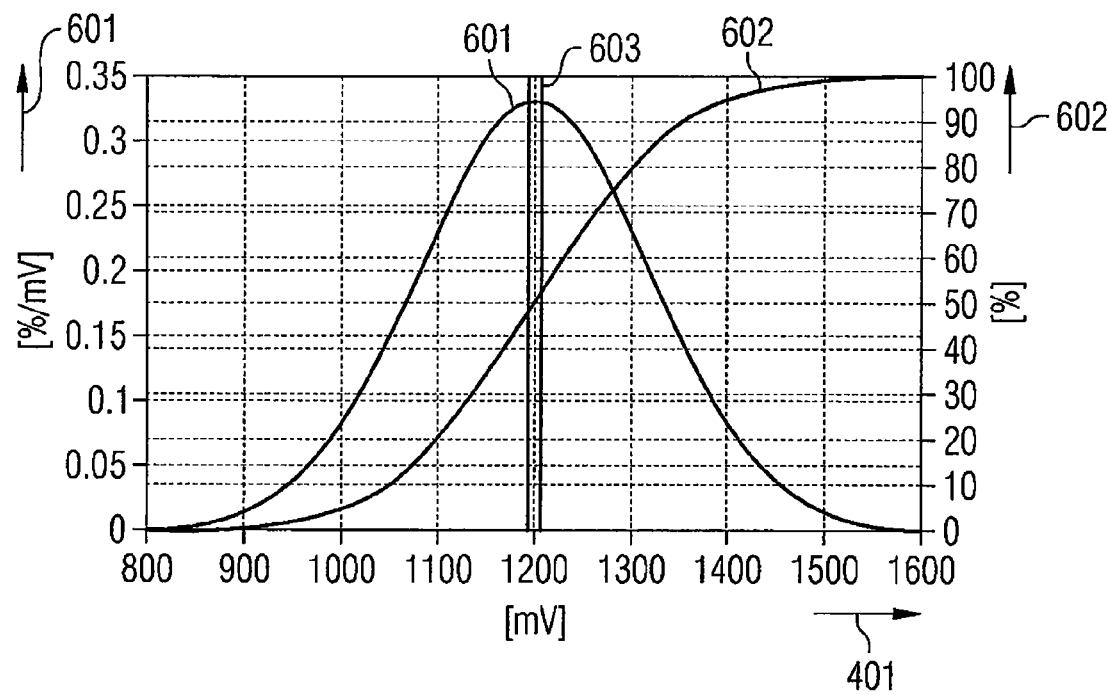

FIGS. 3(a), 3(b) and 3(c) are diagrams each exhibiting a number of samples as a function of a measured voltage drop for three different distribution functions;

FIG. 4 is an example of a numerical simulation for three different voltage drops wherein a voltage average value and a standard deviation value are respectively shown; and FIG. 5 is a graph showing a probability density function, a distribution function and a measurement error limit as a function of the voltage drop across a current detection resistor according to a preferred embodiment of the present invention.

In the Figures, same reference numerals denote the same or similar parts or steps.

DESCRIPTION

The present invention relates to electronic circuits, and relates in particular to electronic circuits having different electrical characteristics such as bandgap voltage, breakthrough voltage, switching current, conduction part resistance, etc.

The present invention specifically relates to an identification device for electronic circuits comprising at least two electronic components having different electrical characteristics, a detection unit configured to detect at least one electrical parameter determining the electronic characteristics of the electronic components and an evaluation unit for evaluating a mismatch exhibited by the at least two electronic components with respect to each other.

An essential idea of the present invention relies upon manufacturing tolerances which are inherent of the manufacturing process of the electronic circuits. A detection unit configured to detect at least one electrical parameter determining electronic characteristics of electronic components contained in the electronic circuits is provided. Furthermore, an evaluation unit for evaluating a mismatch of the electronic components with respect to each other is provided.

Thus, at least one electrical parameter of the electronic components which is detected by the detection unit can be analyzed.

Variations in the manufacturing process result in variations of the electronic characteristics of electronic components contained in the electronic circuits.

A major advantage of the present invention is that no additional identification tag has to be applied to the electronic circuits to be identified. Even in a mass production process, the process variations suffice to securely detect and identify single electronic circuits (chips).

Preferably, the electronic components each comprise bipolar transistors or field effect transistors. Furthermore, it is preferable that the electronic components each comprise PMOS or NMOS transistors.

In a preferred embodiment of the present invention, the different electronic characteristics which may vary in a mass production process comprise at least one of a bandgap voltage, a breakthrough voltage, a switching current and a conduction path resistance. Preferable, at least one electrical parameter is one of a forward biased current, a reverse current, a forward biased voltage and a reverse voltage of the electronic component.

According to a further aspect of the present invention, the identification device for electronic circuits comprises at least two electronic components having slightly different electronic characteristics, a current detection unit configured to detect switching currents of the at least two electronic components and an evaluation unit for evaluating a mismatch exhibited by the at least two electronic components with respect to each other by analyzing the switching currents detected by the current detection unit.

It is preferred that the current detection unit comprises current detection resistors corresponding to each of the circuit components. It is an advantage that at least one voltage drop across the current detection resistor corresponding to one of the circuit components is used to evaluate the mismatch of the electronic components.

Preferably, the at least one voltage drop is generated by the at least one switching current flowing through the current detection resistor. According to a preferred embodiment of the present invention, each current detection resistor comprises an Ohmic resistance.

According to another development of the present invention, a reference voltage source is provided for generating a reference voltage to which the at least one voltage drop is compared. Preferably, the reference voltage is a bandgap voltage provided by the electronic components of the electronic circuit.

The method for identifying electronic circuits according to the present invention comprises the steps of providing at least two electronic components in the electronic circuit wherein the at least two electronic components exhibit slightly different electronic characteristics, detecting at least one electrical parameter of the electronic components by means of a detection unit, determining a mismatch exhibited by the at least two electronic components with respect to each other by means of an evaluation unit on the basis of the at least one electrical parameter and identifying the electronic circuit by analyzing the mismatch of the electronic components provided in the electronic circuit with respect to each other.

Preferably, the step of detecting at least one electrical parameter of the electronic components by means of the detection unit comprises the step of detecting at least one of a forward biased current, a reverse current, a forward biased voltage and a reverse voltage of the electronic components.

According to yet another aspect of the present invention, the method of identifying electronic circuits comprises the steps of providing at least two electronic components in the electronic circuit wherein the at least two electronic components exhibit slightly different electronic characteristics, detecting switching currents of the at least two electronic components by means of a current detection unit, determining a mismatch exhibited by the at least two electronic components with respect to each other by means of an evaluation unit, on the basis of the switching currents of the at least two electronic components, and identifying the electronic circuit by analyzing the mismatch of the electronic components provided in the electronic circuit, with respect to each other.

According to yet another preferred development of the present invention, at least one voltage drop across at least one current detection resistor corresponding to each of the electronic components is used to evaluate the mismatch of the circuit components. Preferably, the at least one voltage drop is generated by the at least one switching current flowing through the respective current detection resistor.

According to yet another preferred development of the present invention, a reference voltage source is provided for generating a reference voltage to which the at least one voltage drop is compared. Preferably, the reference voltage is provided as a bandgap voltage of electronic components of the electronic circuit.

According to yet another preferred development of the present invention, a Gaussian distribution of sample values of the at least one electric parameter is provided by the detection unit. Preferably, the mismatching behavior of the electronic components corresponds to a Gaussian distribution.

It is a major advantage of the present invention that the variation of the voltage drop caused by the switching current is independent of a variation of resistance values of the current detection resistors.

According to yet another development of the present invention, the step of identifying the electronic circuit by analyzing the mismatch of the electronic components provided in the electronic circuits with respect to each other comprises the step of selecting a specified electronic circuit among the electronic circuits a mismatch of which has been determined.

According to yet another preferred development of the present invention, the step of determining the mismatch exhibited by the at least two electronic components with respect to each other by means of the evaluation unit, on the basis of the at least one electrical parameter, comprises determining the mismatch as a function of an operation temperature of the electronic circuit.

Figure 1:
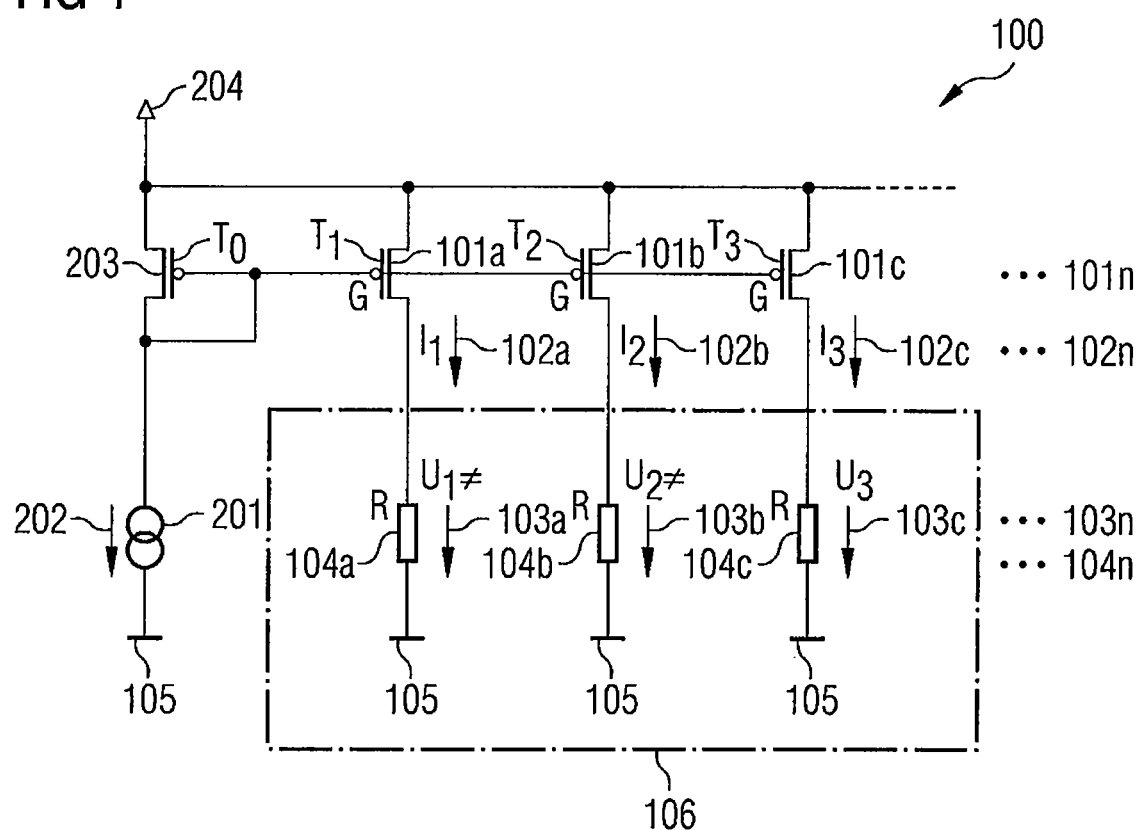
FIG. 1 shows a circuit diagram of an electronic circuit having electronic components and a current detection unit for identifying the electronic circuit, according to a preferred embodiment of the present invention.

FIG. 1 shows a circuit diagram of an electronic circuit 100 having different electronic components 101a-101n. It is noted that the number n of electronic components is not restricted to a specific number in the present embodiment. In the embodiment shown in FIG. 1, the electronic components 101a-101n are field effect transistors, i.e. PMOS or NMOS transistors ($T_1$, $T_2$, $T_3$, ... ).

The electronic circuit 100 to be identified may include further electronic components not shown in FIG. 1. For the present explanation it is assumed that the electronic components 101a-101n each have slightly different electronic characteristics. The different electronic characteristics may comprise at least one of a bandgap voltage, a breakthrough voltage, a switching current, a conduction part resistance, etc. In the embodiment shown in FIG. 1, the switching currents 102a-102n of the electronic components 101a-101n are detected and analyzed.

To this end, a current detection unit 106 is provided for detecting the switching currents 102a-102n. The switching currents 102a-102n are slightly different due to manufacturing tolerances of the field effect transistors 101a-101n.

As shown in FIG. 1, a reference current source 201 providing a reference current 202 is employed in order to operate the electronic components 101a-101n using identical conditions. A control unit 203 is used to provide a current at the gates G of the electronic components 101a-101n. The control unit 203 includes a transistor $T_0$. The control unit 203 is connected in series between a supply voltage source 204 and the reference current source 201. The reference current source 201 is connected between the control unit 203 and ground 105.

The current detection unit 106 essentially comprises current detection resistors 104a-104n each having an Ohmic resistance (R). The current detection resistors 104a-104n each are connected between the electronic components 101a-101n and ground 105. Thus, the switching currents 102a-102n each flow through the respective current detection resistors 104a-104n towards ground 105. Here it is assumed that the Ohmic resistances R of the current detection resistors 104a-104n have identical values.

Thus, manufacturing tolerances of the electronic circuit resulting in slightly different electrical parameters of the electronic components 101a-101n contained in the electronic circuit 100 yield slightly different switching currents 102a-192n. As the switching currents 102a-102n each flow through the respective current detection resistor 104a-104n, a measured voltage drop 103a-103n across the current detection resistor 104a-104n will vary from one electronic component 101a to another electronic component 101b-101n.

The transistors $T_1$, $T_2$, $T_3$ shown in FIG. 1 are PMOS transistors wherein the reference current 202 flows through the transistor $T_0$ of the control unit 203 and is mirrored by the transistors $T_1$, $T_2$, $T_3$ .... Due to manufacturing tolerances it is impossible to produce electronic components 101a-101n (transistors $T_1$, $T_2$, $T_3$, ... in the present example) which have identical electrical parameters.

During the manufacturing processes e.g. differences in geometry and doping exist. Thus, a mismatch between the electronic components 101a-101n exists. This mismatch is the reason for different switching currents 102a-102n. The mismatching effect increases if the size of the electronic components shrinks. The mismatch behavior of the electronic components may correspond to a Gaussian distribution.

Due to the mismatch of the electronic components 101a-101n, the switching currents 102a-102n flowing through the current detection resistors 104a-104n have slightly different values. Thus, voltage drops 103a-103n across the current detection resistors 104a-104n have slightly different values.

It is noted that the current detection resistors 104a-104n have resistance values such that a resistance variation of the current detection resistors 104a-104n only has minor influence on the voltage drop 103a-103n. Thus, it can be assumed that a variation of the voltage drop 103a-103n only depends on the mismatching behavior of the electronic component 103a-103n.

Figure 2:
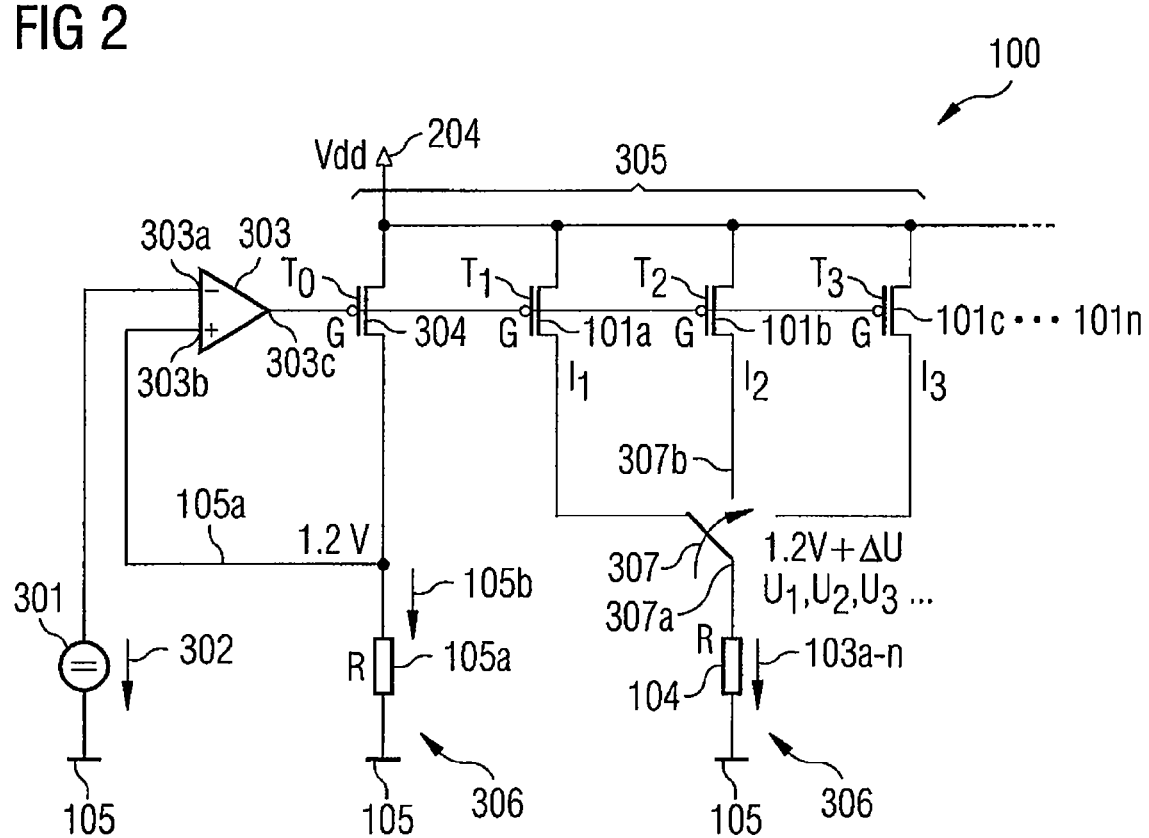
FIG. 2 is a detailed representation of an electronic circuit having an identification device according to another preferred embodiment of the present invention.

FIG. 2 exhibits another preferred embodiment of the present invention. As shown in FIG. 2, only one single current detection resistor 104 is provided and is connected between ground 105 and end terminal 307a of a switching unit 307. The switching unit is designed to switch between different electronic component 101a-101n such that the switching unit connects the connection terminal 307a with a connection terminal 307b which is connected to the respective electronic component 101a-101n. A specific advantage of the embodiment shown in FIG. 2 is the reduced circuit space occupied by the electronic circuit 100.

In order to provide a reference current 202 for the electronic components 101a-101n (see FIG. 1 and description thereof) via their gates, a bandgap voltage is used which is present in most integrated circuits. A reference voltage 302 is provided by a reference voltage source 301, wherein the reference voltage source is connected between ground 105 and an inverting input 303a (−) of the voltage amplifier 303. An output terminal 303c of the voltage amplifier 303 is connected to the gate of an amplifier transistor 304.

Furthermore, the amplifier transistor is connected between a supply voltage source 204 (Vdd) and a connection terminal 303b which is a non-inverting input (+) of the voltage amplifier 303. Furthermore, the connecting terminal 303b is connected to one terminal of a series resistor 105a, the other terminal of which is connected to ground 105. The series resistor 105a has a resistance value around 100 kΩ. Thus that a bandgap voltage of 1.2 V results in a series current 105b of 12 µA. This series current 105b is then reproduced by the electronic components 101a-101n. Furthermore, the currents, i.e. the switching currents 102a-102n, see FIG. 1, result in different voltage drops 103a-n across the current detection resistor 104. Due to the mismatch of the electronic components 101a-101n, the bandgap voltage 105c of 1.2 V is not exactly reproduced. The mismatch results in a voltage drop 103a-103n of 1.2+/−ΔU.

A major advantage of the embodiment shown in FIG. 2 is that a variation of the current detection resistor 104 has no influence on the mismatching behavior of the electronic components 101a-101n. Thus, the mismatching behavior is transferred from a low matching region 305 to a high matching region 306.

FIGS. 3(a), 3(b) and 3(c) show Monte-Carlo-simulations for a 0.25 µm CMOS-process using a current detection resistor of R=100 kΩ and a series resistor 105a of R=100 kΩ. It is noted that the examples shown in FIG. 3(a) to 3(c) are based on the views of three electronic components 101a, 101b and 101c. The graphs of FIG. 3(a) to 3(c) show a distribution of sample numbers 402 as a function of the voltage drop 401. It is noted that the voltage drop 401 corresponds to the voltage measured across the current detection resistor 104 (see FIG. 2) and the current detection resistors 104a-104n (FIG. 1).

FIGS. 3(a), 3(b) and 3(c) exhibit three different distribution functions 403(a), 403(b) and 403(c), respectively. The Monte-Carlo-simulation shown in FIG. 3(a) to 3(c) represents the result after 1000 runs. The histograms shown in FIG. 3(a) to 3(c) exhibit a normal distribution (Gaussian distribution) of the values of the voltage drop 401. As expected, the mean value of the voltages amounts to 1.2 V. The standard deviation amounts to approximately 120 mV. Now minor differences are used to identify the electronic circuit 100 based on the mismatching behavior of the electronic components 101a-101n contained in the electronic circuit 100 (FIGS. 1 and 2).

As shown in FIG. 3(a), the mean value of the distribution of voltage drop values 401 amounts to 1.19907 V, wherein the voltage drops in FIGS. 3(b) and 3(c) are different, i.e. 1.20242 V for the distribution as shown in FIG. 3(b) and 1.19922 V for the distribution shown in FIG. 3(c) respectively.

Furthermore, a distribution of voltage drops 103a, 103b and 103c, i.e. the voltages U1, U2 and U3, in mV are listed in a table for a sample number 402 of 50. A voltage average value 501 of 1195 mV, 1194 mV and 1202 mV, respectively, is obtained, wherein a respective standard deviation value 502 of 124 mV, 125 mV and 122 mV, respectively, is obtained.

It is noted that the larger the deviations of the respective voltage drops 401, i.e. the voltage average values are, the easier it is to distinguish and identify an electronic circuit 100 having electronic components 101a, 101b, 101c. A further aspect is the behavior of the mismatch over time, i.e. the lifetime of the integrated circuit. If there is a drift behavior which is equal for all electronic components 101a, 101b, 101c, an offset may be applied.

In order to increase a constant behavior of the mismatch related to temperature variations and variations in the supply voltage measures such as the provision of cascode transistors may be applied.

FIG. 5 shows graphs of a probability density function 601, a distribution function 602 and a measurement error limit 603 as a function of the voltage drop 401.

The curves shown in FIG. 5 are results of the simulation in order to evaluate how many stages or levels are necessary in order to provide a reliable coding of a sufficient number of electronic circuits 100.

As before (FIG. 3 and FIG. 4), the voltage average value 501 amounts to 1200 mV and the standard deviation value 502 amounts to 120 mV. The result of the simulation is converted into the normal distribution (distribution function) 602 which is an integrated density function the limit value of which amounts to 100%. Furthermore, the probability density function 601 (Gaussian distribution, bell-shaped curve) is represented having its maximum value at a voltage drop 401 of 1200 mV.

Furthermore, the limits for the measurement error 603 are depicted around 1200 mV, i.e. around the maximum of the probability density function 601. The measurement error limit 603 shown in FIG. 5 in the present embodiment amounts to +/−5 mV. Thus, a region of 10 mV is covered by the measurement error limit 603. This is a value which can be achieved by test equipment during application of the electronic circuit 100.

The value of the measurement error limit 603 together with the standard deviation value 502 determines the number of coding levels. For an estimation of the coding levels, the limits are shown at the position of the highest probability density, i.e. around 1200 mV in the diagram of FIG. 5. Here, the density amounts to approximately 0.33% per mV. This means that within the measurement error limit 603 of 10 mV 3.3% of all electronic components are included. This means that approximately 30 possible windows may be provided in which 3.3% of the electronic circuits are included. The probability that a measured voltage coincides with a voltage measured previously such that the measured voltage is in the same window, therefore is below 1/30.

Thus, it is possible to determine how many stages (number of generated switching currents 102a-102n, i.e. the number n, see FIGS. 1 and 2) are necessary in order to select a specific electronic circuit 100 from a number of electronic circuits.

In the following, it is assumed that the measurement error limit 603, i.e. the window width, amounts to 10 mV. The number of stages is determined by the following equation:

$$n = \lg(IC\text{-number})/\lg(30),$$

where IC-number is the number of electronic circuits (ICs), and lg represents the logarithm.

Thus, the probability amounts to approximately 50% that only one electronic circuit 100 is selected. Applying an additional stage reduces the probability of an additional selection of an electronic circuit 100 by 1/30. Thus it is possible to increase the probability of a single detection to more than 98% wherein in the other cases (<2%) additional electronic circuits 100 are found. It is to be noted that the electronic circuit 100 of interest is always included.

In order to restrict a multiple detection to a range lower than 10, the following formula is applied:

$$n = 2 \cdot \lg(IC\text{-number})/\lg(30).$$

Thus, if it is assumed that the IC-number amounts to $10^6$, eight levels of voltage drops 401 are required. The number of multiple detections amounts to approximately 6 ppm.

The result of the evaluation may then be compared to previous evaluation stored in a database in order to identify the electronic circuit.

Thus, an efficient and secure identification of electronic circuits without employing additional memory components is possible.

What is claimed is:

1. An identification device for electronic circuits, comprising:
   a) at least two electronic components having different electronic characteristics;
   b) a current detection unit having at least two current detection resistors corresponding to the at least two electronic components, respectively, and each configured to measure a switching current output, respectively, from each of the at least two electronic components, wherein the switching currents are used to determine the respective values of the electronic characteristics;
   c) an evaluation unit configured to evaluate a mismatch exhibited by the at least two electronic components with respect to each other by analyzing the switching currents detected by the current detection unit; and
   d) a reference voltage source configured to generate a reference voltage,
   wherein at least one voltage drop across at least one of the current detection resistors corresponding, respectively, to one of the electronic components is used to evaluate the mismatch of the electronic components and the at least one voltage drop is compared with the reference voltage, and
   wherein each of the electronic components comprises a bipolar transistor or a field effect transistor.

2. The identification device according to claim 1, wherein the electronic components each comprise PMOS or NMOS transistors.

3. The identification device according to claim 1, wherein the different electronic characteristics comprise at least one of a bandgap voltage, a breakthrough voltage, a switching current, and a conduction path resistance.

4. The identification device according to claim 1, wherein plurality of currents are each at least one of a forward biased current, a reverse current, a forward biased voltage, and a reverse voltage of the electronic components.

5. The identification device according to claim 1, wherein the at least one voltage drop is generated by at least one switching current flowing through the at least one current detection resistor.

6. The identification device according to claim 1, wherein the current detection resistors comprise Ohmic resistances.

7. The identification device according to claim 1, wherein the reference voltage is a bandgap voltage provided by electronic components of the electronic circuit.

8. A method for identifying electronic circuits, comprising:
   a) providing at least two electronic components in the electronic circuit, wherein the at least two electronic components exhibit different electronic characteristics;
   b) detecting a plurality of currents output, respectively, from each of the electronic components by a detection unit having at least one current detection resistor, wherein the plurality of currents are used to determine the respective values of the electronic characteristics;
   c) determining a mismatch exhibited by the at least two electronic components with respect to each other by an evaluation unit, on the basis of the plurality of currents output;
   d) providing a reference voltage; and
   e) identifying the electronic circuit by analyzing the mismatch of the electronic components provided in the electronic circuit, with respect to each other,
   wherein at least one voltage drop across the at least one current detection resistor is used to evaluate the mismatch of the electronic components and the at least one voltage drop is compared with the reference voltage.

9. The method according to claim 8, wherein the detecting step comprises detecting at least one of a forward biased current, a reverse current, a forward biased voltage, and a reverse voltage of the electronic components.

10. The method according to claim 8, wherein the detection unit is a current detection unit and a switching current of a transistor is detected using a plurality of current detection resistors corresponding to each of the circuit components, respectively.

11. The method according to claim 10, wherein at least one voltage drop across at least one of the plurality of current detection resistors is used to evaluate the mismatch of the circuit components.

12. The method according to claim 11, wherein the at least one voltage drop is generated by the at least one switching current flowing through at least one of the plurality of current detection resistors.

13. The method according to claim 11, wherein the variation of the voltage drop caused by the switching current is independent of a variation of resistance values of the current detection resistors.

14. The method according to claim 10, wherein the current detection resistors comprise Ohmic resistances.

15. The method according to claim 8, wherein the reference voltage is provided as a bandgap voltage of electronic components of the electronic circuit.

16. The method according to claim 8, wherein a Gaussian distribution of sample values of the plurality of currents is provided by the detection unit.

17. The method according to claim 8, wherein the mismatching behaviour of the electronic components corresponds to a Gaussian distribution.

18. The method according to claim 8, wherein the identifying the electronic circuit by analyzing the mismatch of the electronic components provided in the electronic circuit with respect to each other comprises selecting a specified electronic circuit among the electronic circuit a mismatch of which has been determined.

* * * * *